(12) United States Patent
Gross et al.

(10) Patent No.: US 11,783,898 B2
(45) Date of Patent: Oct. 10, 2023

(54) EPHEMERAL STORAGE ELEMENTS, CIRCUITS, AND SYSTEMS

(71) Applicant: JONKER LLC, Zephyr Cove, NV (US)

(72) Inventors: John Nicholas Gross, Berkeley, CA (US); David K. Y. Liu, Fremont, CA (US)

(73) Assignee: JONKER LLC, Zephyr Cove, NV (US)

( * ) Notice: Subject to any disclaimer, the term of this patent is extended or adjusted under 35 U.S.C. 154(b) by 851 days.

(21) Appl. No.: 14/857,275

(22) Filed: Sep. 17, 2015

(65) Prior Publication Data

US 2016/0086670 A1 Mar. 24, 2016

Related U.S. Application Data

(60) Provisional application No. 62/052,388, filed on Sep. 18, 2014.

(51) Int. Cl.

| G11C 16/14 | (2006.01) |
|---|---|
| G11C 16/26 | (2006.01) |
| G11C 16/32 | (2006.01) |
| G11C 16/04 | (2006.01) |
| G11C 16/34 | (2006.01) |
| H01L 27/1159 | (2017.01) |

(52) U.S. Cl.
CPC .......... *G11C 16/14* (2013.01); *G11C 16/0483* (2013.01); *G11C 16/26* (2013.01); *G11C 16/32* (2013.01); *G11C 16/3431* (2013.01); *H01L 27/1159* (2013.01)

(58) Field of Classification Search
CPC .................................................... G11C 16/14
See application file for complete search history.

(56) References Cited

U.S. PATENT DOCUMENTS

| 4,266,283 | A | * | 5/1981 | Perlegos | ............ | G11C 16/0433 |
|---|---|---|---|---|---|---|
| | | | | | | 257/316 |
| 4,409,670 | A | | 10/1983 | Herndon et al. | | |
| 6,345,000 | B1 | | 2/2002 | Wong et al. | | |
| 6,625,734 | B1 | | 9/2003 | Marvit et al. | | |
| 7,092,288 | B2 | | 8/2006 | Lojek | | |
| 7,199,394 | B2 | | 4/2007 | Mandell et al. | | |
| 7,260,672 | B2 | | 8/2007 | Garney | | |
| 7,273,766 | B1 | | 9/2007 | Lan et al. | | |
| 7,489,542 | B2 | | 2/2009 | Chen et al. | | |

(Continued)

FOREIGN PATENT DOCUMENTS

CN 103730164 A 4/2014

OTHER PUBLICATIONS

Aritome, S., et al., "Reliability Issues of Flash Memory Cells," Proc. IEEE, vol. 81, No. 5, May 1993.

(Continued)

*Primary Examiner* — Douglas King

(57) ABSTRACT

An array of programmable non-volatile devices are is adapted such that their logic state is controllably altered over time by quiescent changes, slow controlled changes, scheduled changes, or some combination thereof imposed at a physical level. This allows for improved security and privacy for data to be permanently deleted. In some applications a data refresh and/or automatic backup can be implemented as well.

30 Claims, 8 Drawing Sheets

(56) References Cited

U.S. PATENT DOCUMENTS

| | | | |
|---|---|---|---|
| 7,679,945 | B2 | 3/2010 | Rizzo et al. |
| 7,881,108 | B2 | 2/2011 | Cornwell et al. |
| 8,327,068 | B2 | 12/2012 | Nakanishi et al. |
| 8,331,128 | B1 | 12/2012 | Derhacobian et al. |
| 8,374,746 | B2 | 2/2013 | Plante |
| 8,456,880 | B2 | 6/2013 | Norman |
| 8,488,397 | B2 | 7/2013 | Elfadel et al. |
| 8,745,347 | B2 | 6/2014 | Ferren et al. |
| 8,817,530 | B2 | 8/2014 | Alam et al. |
| 8,909,725 | B1 | 12/2014 | Sehn |
| 2003/0131060 | A1* | 7/2003 | Hartselle ............. G06Q 10/107 709/206 |
| 2003/0161186 | A1* | 8/2003 | Aasheim ............. G06F 12/0246 365/185.29 |
| 2005/0051053 | A1 | 3/2005 | Wisnudel et al. |
| 2006/0126484 | A1 | 6/2006 | LeBlanc et al. |
| 2007/0233955 | A1 | 10/2007 | Luo et al. |
| 2008/0162869 | A1 | 7/2008 | Kim et al. |
| 2009/0208692 | A1 | 8/2009 | Lindholm et al. |
| 2010/0205357 | A1* | 8/2010 | Mukaida ............. G06F 12/0246 711/103 |
| 2012/0208595 | A1 | 8/2012 | Norman |
| 2012/0292613 | A1 | 11/2012 | Shionoiri et al. |
| 2013/0070530 | A1* | 3/2013 | Chen ..................... G11C 5/063 365/185.11 |
| 2013/0265830 | A1 | 10/2013 | Bisen |
| 2013/0290443 | A1 | 10/2013 | Collins et al. |
| 2013/0346805 | A1 | 12/2013 | Sprouse et al. |
| 2014/0068183 | A1 | 3/2014 | Joshi et al. |

OTHER PUBLICATIONS

Gao, W. and W. Martin Snelgrove, "The floating gate MOS device as an analogue trimming element," Microelectronics Journal, vol. 25, No. 5, pp. 353-361, Aug. 31, 1994.

Geldman, J., "Sanitize Command," Technical Committee T13: AT Attachment, Internet. Available at http://www.t13.org/.../e07197r7-T13_Sanitize_Command_Proposal.pdf, Jun. 10, 2008.

Gerber, A., et al., "Low-Voltage Operation of Metal-Ferroelectric-Insulator-Semiconductor Diodes Incorporating a Ferroelectric Polyvinylidene Fluoride Copolymer Langmuir-Blodgett Film," Stephen Ducharme Publications, Paper 30, Jul. 26, 2006.

Huang, Yifei, "Amorphous Silicon TFT Based Non-Volatile Memory" Diss. Internet. Available at https://www.princeton.edu/sturm/publications/phd-theses/pdfs/Part%20II%20Yifei_Huang_thesis.pdf. Last visited Jan. 20, 2016.

Kim, J. H., et al., "Charge Loss Mechanisms in a Stacked-Gate Flash EEPROM Cell with an ONO Inter-Poly Dielectric," J. Korean Physical Soc., vol. 39, No. 6, pp. 1103-1106, Dec. 6, 2001.

Kissel, Richard, et al., "Guidelines for Media Sanitization," NIST Special Publication 800-88, Rev. 1, Dec. 2014.

Patrizio, A., "DVDs That Self-Destruct," Wired, Jan. 20, 2000.

Postel-Pellerin, J., et al. "Charge Loss Activation During Non-Volatiles Memory Data Retention," CAS International 2012, vol. 2., pp. 377-380, Oct. 15-17, 2012.

Reece, T., "Characterization of Metalferroelectric-Insulator-Semiconductor Structures Based on Ferroelectric Langmuir-Blodgett Polyvinylidene Fluoride Copolymer Films for Nondestructive Random Access Memory Applications," Theses, Dissertations, and Student Research: Department of Physics and Astronomy, University of Nebraska—Lincoln, Dec. 6, 2007.

Sakai, Shigeki and Mitsue Takahashi, "Recent Progress of Ferroelectric-Gate Field-Effect Transistors and Applications to Nonvolatile Logic and FeNAND Flash Memory," Materials, vol. 3., pp. 4950-4964, Nov. 18, 2010.

Swanson, Steven and Michael Wei, "SAFE: Fast, Verifiable Sanitization for SSDs Or: Why Encryption Alone is not a Solution for Sanitizing SSDs," Non-Volatile Systems Laboratory, Computer Science and Engineering, Univ. Calif. San Diego, Oct. 13, 2010.

Vasileska, Dragica, "Modeling of Non-Volatile Memories with Silvaco," Arizona State University, Jul. 6, 2011.

Wei, M., et al. "Reliably Erasing Data from Flash-Based Solid State Drives." FAST. vol. 11. 2011.

Zhao, C., et al., "Review on Non-Volatile Memory with High-k Dielectrics: Flash for Generation Beyond 32 nm," Materials, vol. 7, pp. 5117-5145, Jul. 15, 2014.

* cited by examiner

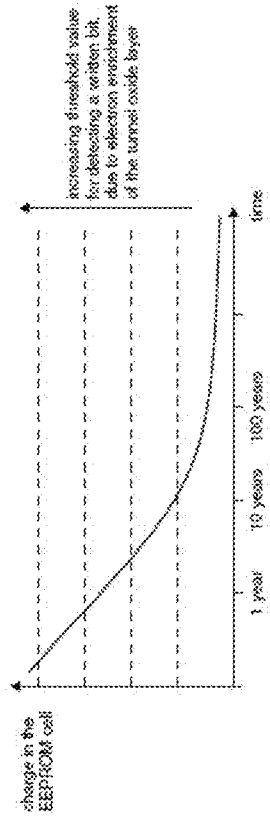
FIG. 5A Conventional cell
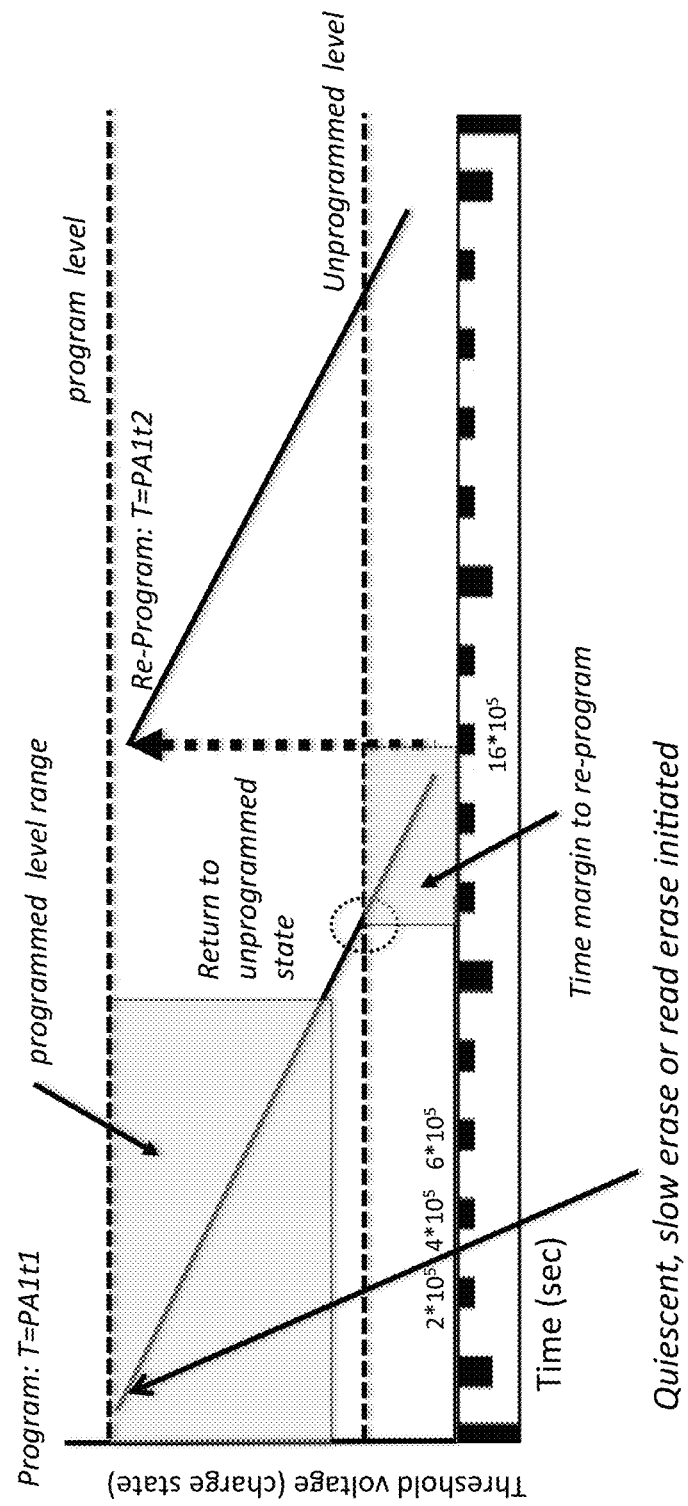
FIG. 5B Reduced Retention cell

EPHEMERAL STORAGE ELEMENTS, CIRCUITS, AND SYSTEMS

RELATED APPLICATION DATA

The present application claims the benefit under 35 U.S.C. 119(e) of the priority date of Provisional Application Ser. No. 62/052,388 filed Sep. 18, 2014 which is hereby incorporated by reference.

FIELD OF THE INVENTION

The present invention relates to non-volatile memories which are engineered or controlled to have limited data retention times. The invention has particular applicability to applications where is it necessary or desirable to retain data only for limited periods.

BACKGROUND

Non-volatile storage elements, including solid state forms (capacitive based EPROMs, flash, ferroelectric), magnetic form (tape, hard drives), organic/phase change form etc. traditionally have been engineered to maximize data retention time. In fact, increasing data retention is a significant engineering goal of artisans in the industry. The academic and patent literature is replete with such efforts, a typical example of which is an article entitled "Reliability Issues of Flash Memory Cells" by Aritome et al. appearing in PROCEEDINGS OF THE IEEE. VOL. 81. NO. 5. May 1993. As another reference notes:

Widespread use of nonvolatile memories in production systems requires data retention for ten years or more.

See "A Nonvolatile Memory Overview" by Makwana et al., available at http://aplawrence.com/Makwana/non-volmem.html. Both of the aforementioned articles are incorporated by reference. In fact the definition of "non" volatile in its conventional sense is understood in the electronics industry to mean data that retains its state for extended periods of time, i.e. from several years to decades.

Applicants' disclosed embodiments turn this principle on its head, and proffers certain types of elements, circuits and systems which can be designed, created and configured to behave exactly the opposite to that proposed in the prior art: namely, with intentionally reduced retention times. These ephemeral storage elements can be used in a number of applications where it is only really required to have limited or quasi-permanence (such as in security installations), or in fact, where there are significant benefits from constrained retention times (social media, portable devices, content distribution and similar domains).

As is apparent therefore, the prior art, therefore, completely teaches away from the approach discussed herein. Generally speaking, any memory element with a short retention rate has been considered undesirable and unusable for any meaningful applications. In fact short data retention has usually been the result of degradation caused by limited endurance designs, i.e., excessive wear from read/write cycling, and not as a deliberate engineering goal.

While some elements and storage devices have been implemented in the past with engineered—planned obsolescence to the inventors' knowledge these have been generally limited to DVDs and related optical storage. Some organic memories have been proposed with variable retention times (see U.S. Pat. No. 7,273,766 incorporated by reference herein), which uses a selectively conductive decay media. Again in all instances again the stated objective was to maximize, not reduce retention time. Similarly older tape based systems (see U.S. Pat. Nos. 4,409,670 and 8,374,746 incorporated by reference) were known to use a "round-robin" scheme in which data was written to a finite sized loop of tape, and then later over-written by new data. These systems re-used common data structures, but did not work from a principle of reduced data retention.

The present embodiments help to solve significant new problems arising from the rapid proliferation of data from individuals which was not intended to be widely disseminated, or to last forever. Recent press stories discuss at length the loss of privacy and risk to reputation of persons who inadvertently create photos, videos or other multimedia data that are embarrassing but yet are never removed from the Internet, because the latter has a "permanent" memory. In reality the Internet of systems, servers and users has a "permanent" memory because nothing can be forgotten.

Some recent systems attempt to ameliorate this issue by limiting the life of certain media, by making it semi-permanent. Snapchat, for example, incorporates logic that tries to delete photos over time so that they are semi-permanent. Cyberdust attempts to do the same thing. Some email systems similarly try to make electronic messages "disappear." More recently Facebook (a social network) has announced that they will make postings only last for a certain period of time, by letting people schedule them for "deletion" at a later date. Apple's recent iOS update similarly auto-deletes photographs after a certain period of time. These systems are based on virtual programming/operating system tricks that remove pointers, keys, etc., to make a file less findable, or less readable (encrypted). These systems do not attempt to alter or change the underlying media in which the data is stored on a physical, irreversible level.

SUMMARY OF THE INVENTION

An object of the present invention, therefore, is to overcome the aforementioned limitations of the prior art. Embodiments of the present invention permit users, system operators, etc., to create new classes of content with controllable, semi-permanent attributes. The lifetime of these limited files is imposed preferably through hardwired, mask level selection options during manufacturing so they are untamperable. This fulfills a long term need in the burgeoning information industry, which has no useful mechanism to intentionally age and destroy information that is no longer wanted by the authors or recipients under controlled conditions.

DESCRIPTION OF THE DRAWINGS

FIG. 5A is a diagram depicting a typical charge storage behavior of a conventional non-volatile memory device over time;

FIG. 5B is a diagram depicting a typical charge storage behavior over time of a non-volatile memory device implemented in accordance with the present teachings;

DETAILED DESCRIPTION

Figure 1:
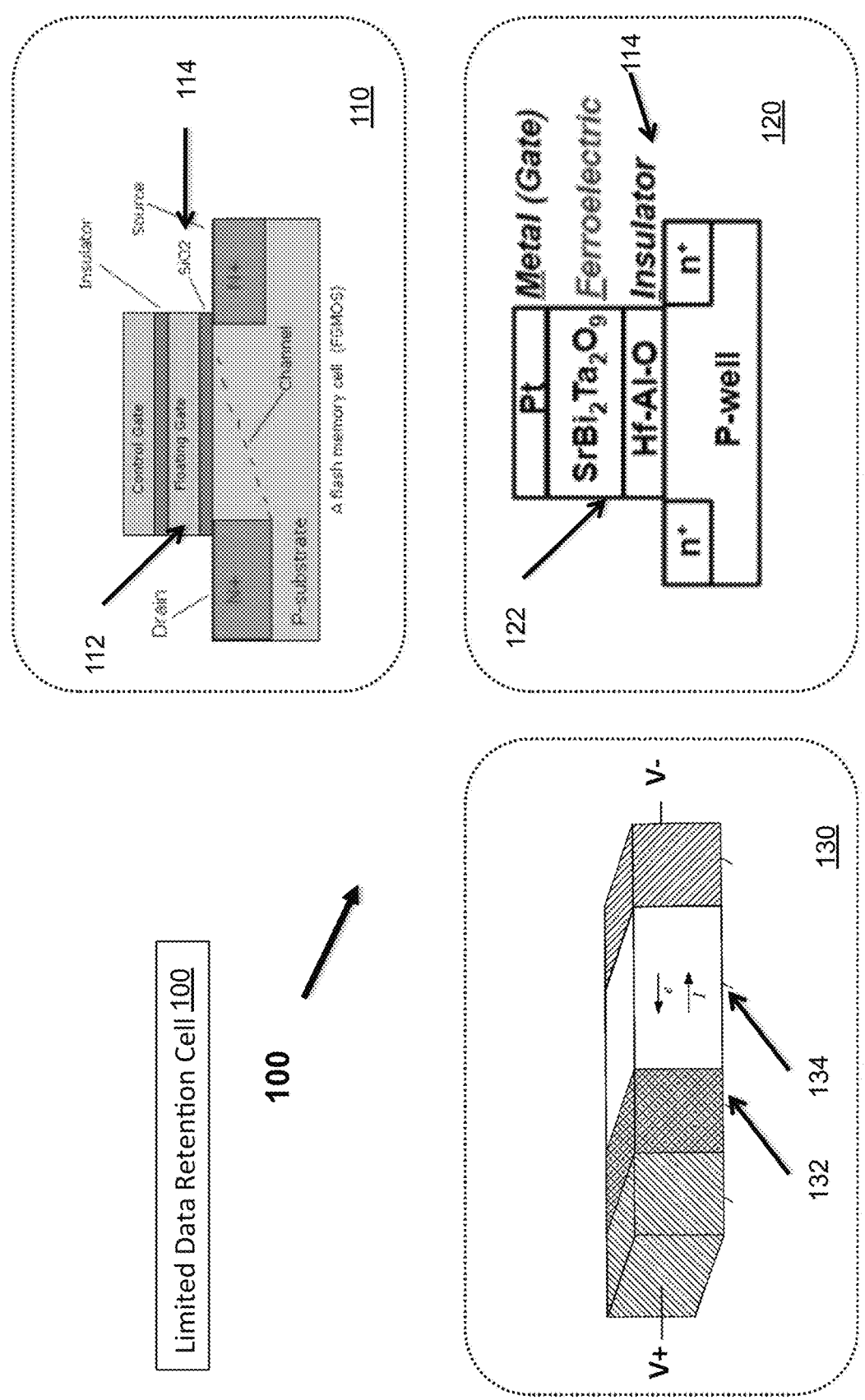
FIG. 1 provides examples of embodiments of configured limited data retention (ephemeral) cells.

Ephemeral storage elements as described herein are intentionally engineered and configured to be capable of limited retention times preferably extending from a few minutes to a few hours, days, or months at most. In some applications it may be even a few years. For example in a store security application, where it is only necessary to retain data for a few days, or perhaps a week before it becomes unuseful, the retention time for different subportions of the memory device may be as little as a few hours to store images/video in distinct time slices. In content distribution systems where it is desired to rent or lease content short term, it may be only necessary to have data that is retained for a few days. In social networking applications where members are storing photographs, videos, etc., it may be more useful to have longer retention times extending for a few months or even a few years.

It will be understood that each application will require or benefit from different levels of ephemeralness, and accordingly the degree of retention, and the degree of enforcement (i.e., hardcoded vs. soft-coded) will vary in different commercial applications. In general a desired time coverage will nonetheless usually extend significantly below the lower bound of comparable existing and prior art functional and useful non-volatile memory elements. Furthermore in most applications, to enhance security and ensure reliability, enforcement of the data retention characteristics is imposed at the device level through physical options implemented during device manufacture, including for example fixed firmware, mask selection, etc.

In first embodiments the memory system does not include any kind of separate electrical erase mechanism, and does not require circuitry or control logic to re-write new data after the old data expires. In such mode the ephemeral memory operates primarily by an irreversible "self-erasing" mechanism that is inherent to a quiescent state of the device. To bring such mechanism into play the individual cells are engineered with characteristics (for example, in an EPROM, with reduced tunnel oxide) that enhance charge leakage without requiring additional active operations. The target or nominal amount/rate of charge leakage can be tailored to specific applications to permit different retention periods. In some embodiments, an optional refresh cycle can be implemented by a memory controller to refresh the contents of the memory cells by re-programming them to their desired state at controllable periodic intervals. This has the effect of making the memory effectively emulate a form of DRAM (albeit slower) which may be useful in some applications, including testing.

Another way to effectuate this self-erase is to tailor a read operation such that data will be destroyed inherently and as party of/by the read operation, such as described in provisional Ser. No. 62/057,856 by the present inventors and which is incorporated by reference. This can enhance the security of the data to be just one time, single access. In this variation, a retention time does not need to be altered, and thus a conventional, full non-volatile storage cell can be used and maintained until the data is accessed.

In second embodiments it may be desirable to further control a data retention period through additional active operations, such as with a slow (or extremely slow) erase operation. Alternatively, a mandatory, irreversible re-write of blank (or random) data may be imposed at the target retention times. Again this type of operation may be used with conventional, full non-volatile storage cells so data is maintained until such scheduled re-write.

The onset of the slow erase operation (or mandatory re-write) can be controlled as well for any particular application to achieve a target data retention behavior. In contrast to some prior art techniques, which only erase when new data is to be written, the slow erase operation is performed for such cells even in the absence of new data for such cell. Again, unlike a conventional erase operation, embodiments of the present invention are intended to be implemented over significant periods of time to achieve a shortened, controlled data retention at a physical level.

It will be understood that hybrids of such embodiments also can be implemented as desired. In each of these embodiments enforcement of the limited data retention options can be achieved in either or both hardware (firmware) and software (programmable) form. For example, a device may be configured during manufacture at the mask level to irreversibly lose (or re-write) data over set periods of 1 day, 10 days, 100 days, and so on. This makes it possible to implement security and privacy at the device level, and makes it practically impossible to circumvent.

Embodiments of the present invention therefore complement the technology and innovations previously disclosed in U.S. application Ser. No. 14/452,269 and 14/452,275, both filed Aug. 5, 2014 and incorporated by reference in their entireties. These latter applications disclose embodiments particularly suited for so-called "cold data" storage applications, wherein high density (including multi-level cells), inexpensive flash based solid state random access memory is adapted particularly for long retention but with limited write capability. This is not necessary in many new applications where the use case (i.e., online social network multimedia files) is mostly directed to backups and storage of data that does not change frequently, and speed is not critical.

By way of comparison, the innovative cells of the present invention which include a self-erase characteristic, can be implemented as "warm data" storage. That is, because they are configured to return to a non-programmed state, they are useful for use cases such as data caches where data is not intended or required to reside for very long anyway.

The additional innovative data re-writing techniques discussed herein (including through slow-erase, scheduled erase, and read-erase) are useful in conventional flash memory cell embodiments as well, and thus can be incorporated in "hot data" applications, or other applications where it is desirable to increase security, user privacy, etc. Again they are compatible as well with applications that may use a data refresh cycle as well.

FIG. 1 shows examples of different kinds of limited retention cells 100 that can be employed in embodiments of the present invention, including electrically programmable memory cells (Eprom) 110; ferroelectric cells 120; and phase change memory cells 130 to name representative examples. Each of these architectures is known in the art as a fundamental element of non-volatile memory systems, and each is universally and routinely optimized (through component geometry, materials and biasing) to increase data retention to be as great as possible for a particular data state. It will be understood that these are just typical of contemporary non-volatile memory cells, and it is expected that future technologies will be adopted which rely on similar mechanisms to program/erase/read data.

First physical embodiments of the present invention are based on modifying some of these basic components to effectuate a limited data retention, or self-erasing cell. For example in a flash type cell 110 which stores charge on a floating gate 112, one of the key limiting factors in data retention is a thickness of tunnel oxide 114. In a typical cell program operation, a positive bias is applied to control gate 116, which attracts negative carriers from the channel, and which accumulate on the floating gate 112. Additional biasing is applied to source/drain regions depending on whether FN tunneling or hot channel electron injection is employed. The parameters of this programming operation are not critical to the present invention, and can be effectuated in any number of ways known in the art.

Cell 110 has a native, unprogrammed threshold voltage Vt, which is relatively low, and can considered a logical 1 state. That is, a read signal bias applied to the cell components will determine that current will indeed flow between the source and drain regions.

The addition of charge to FG 112 changes (increases) a threshold voltage (Vt) of cell 110 as is well-known in the art. At this point cell 110 can then be considered in a programmed "0" state, because current is suppressed (will not flow) in the channel when a read bias is applied to the cell. The change in the threshold of the cell means that the cell will not turn on absent a significantly larger bias voltage.

It is well known, however, that flash memory cells 110 inherently have some form of leakage current ($I_{fC}$), meaning charge eventually bleeds off the floating gate 112 to the substrate, reverting the cell back to its original unprogrammed state over an extended period of time. However, in conventional cell designs this leakage current is engineered and controlled so that at most an electron or two is lost every other day.

The leakage current is a well-known function of the geometry of the cell, including the thickness (d) of the tunnel oxide layer 114. This is because generally in a memory cell, $dQ=C*dV$, meaning the change in charge (Q) is related to the cell capacitance and the change in voltage. The capacitance of the memory cell is proportional to A (area of the floating gate)/d (thickness of oxide) so the change in charge over time $dQ/dt=I_{lc}$ is also inversely proportional to the oxide thickness. Consequently, using conventional cell simulation software and other known mathematical relationships, it is relatively straightforward (for any particular geometry and application) to derive an oxide thickness that will yield a desired native, quiescent charge leakage behavior, including a target leakage rate. In most applications it is expected that the oxide thickness will be less than 50 A, and perhaps as little as 30-40 A, at which point direct tunneling (as opposed to simply FN tunneling) will contribute primarily to charge loss. The particular thickness required to achieve a target reduced retention time can be derived for any application based on standard integrated circuit modelling software tools and routine experimentation.

Consequently, a self-erasing EEPROM cell 110 of the present invention is preferably implemented using a predetermined reduced oxide thickness which matches a desired leakage behavior to achieve a self-erase within a certain target time period. While oxide thickness is one parameter for achieving this result, it will be understood that other parameters of the cell (including biasing as described below) could be adjusted to facilitate or control the discharge behavior. For example other structural modifications to the geometry and relationship of the cell elements can be introduced and formed to bring about an increased controlled leakage rate.

In addition, as alluded to above, a memory controller (see FIG. 2A 220) may optionally implement a modified refresh mechanism to refresh the data in the cells 110, based on the retention characteristics of the cells. This feature, too, can permit the oxide thickness to be less than that typically used by non-volatile memory cells in a flash memory array. In other words, for embedded applications it may be desirable to have an oxide thickness that is the same or approximately the same as a logic gate thickness, or an I/O driver thickness (which is usually thicker) for processing simplicity. Such oxide thicknesses are not typically sufficient in some embedded applications to implement and support a conventional EPROM cell; however, using the novel cell and refresh mechanism described herein, it is possible to implement a leaky EPROM cell that is simply refreshed periodically. This can open up new applications for non-volatile memory cells since the scaling of such memories has not matched that of conventional FETs. The refresh period can be determined again using routine experimentation for any particular cell design. While the refresh cycle adds some array maintenance/overhead, it may be useful in some applications where access to power is not an issue, and true non-volatility is not required except during active operation.

Other forms of cells could be modified to include a self-erasing behavior, including ferroelectric 120 and phase change 130 types. Ferroelectric cells share many common features with EEPROM cells, and for this reason a tunneling insulator 114 dimension or composition could be similarly tailored to achieve a target self-erase behavior. An article by Gerber et al. titled "Low-voltage operation of metalferroelectric-insulator-semiconductor diodes incorporating a ferroelectric polyvinylidene fluoride copolymer Langmuir-Blodgett film" JOURNAL OF APPLIED PHYSICS 100, 024110 I 2006 (incorporated by reference herein) explains quite clearly that these types of cells are considered less attractive for most conventional applications because of their poor retention characteristics. In fact, while proposed in 1963, the article explains that they have no known commercial applications (as of 2006) and in large part this is due to poor retention, which it describes as only a few days. The article goes on to describe cells which have retention times as low as a few minutes, which it acknowledges as unacceptable for useful applications (as it contemplates that term). While these embodiments are not appropriate for the conventional applications contemplated by the article, the inventor posits that these adjustable characteristics in fact make them prime useful candidates for the types of circuits, devices and systems described herein for other applications previously unappreciated.

Organic cells 130 can be similarly employed in embodiments of the present invention. These devices include a passive layer 132 (a charge carrier assisting material), and an active organic conductor layer 134. The ability to implement different retention times in such types of devices is described in U.S. Pat. No. 7,199,394 incorporated by reference herein. In the reference, however, the retention times proposed only include a lower range of DRAM behavior (milliseconds) to full NVM type behavior (i.e., several years). Such cells could be further modified in accordance with the present teachings to yield cells with different retention times, on the order of hours or days, for purposes of implementing the new applications described herein.

In addition to the embodiments that are implemented using only an inherent, quiescent erase, other types—including conventional high endurance, long retention cells—can incorporate more active erase operations to achieve a desired erase time. This is achieved, as explained below, by incorporating a novel combination of program/erase, in which flash cells are programmed but then immediately subjected to a low intensity erase, or an erase as part of a read operation. The timing of the onset of the slow erase, and the total amount of time required, can all be controllable as desired for any particular application. This novel behavior effectively emulates what is again typically considered an undesirable condition, because it imitates stress induced leakage current, which normally arises as a result of damage to the oxide layer. However here the induced leakage current is provided as part of a very slow erase operation, so that the same discharge effect is achieved, but without accompanying damage. In an erase as part of read operation, biasing can be applied to bring about an operation that introduces opposite polarity of charges to neutralized the stored charge, including through intentional and controlled injection of a predetermined quantity of holes.

Alternatively in embodiments where an erase circuit is not desired or possible (for example an embedded application), a cell of the type described in U.S. Ser. Nos. 14/452,269 and 14/452,275 (incorporated by reference) can be employed. This novel cell is "erased" by a re-programming operation which pushes the cell nominal programmed state (Vt1) to a higher Vt2. This novel cell—which is particularly suited for "cold data" applications as noted earlier—can thus be adapted for "warm" data applications by making it re-programmable when the data is no longer needed. Devices and systems can be hardwired to perform re-programming operations at regular, fixed, controllable intervals to effectuate physical "erase" of old data.

Figure 2A:
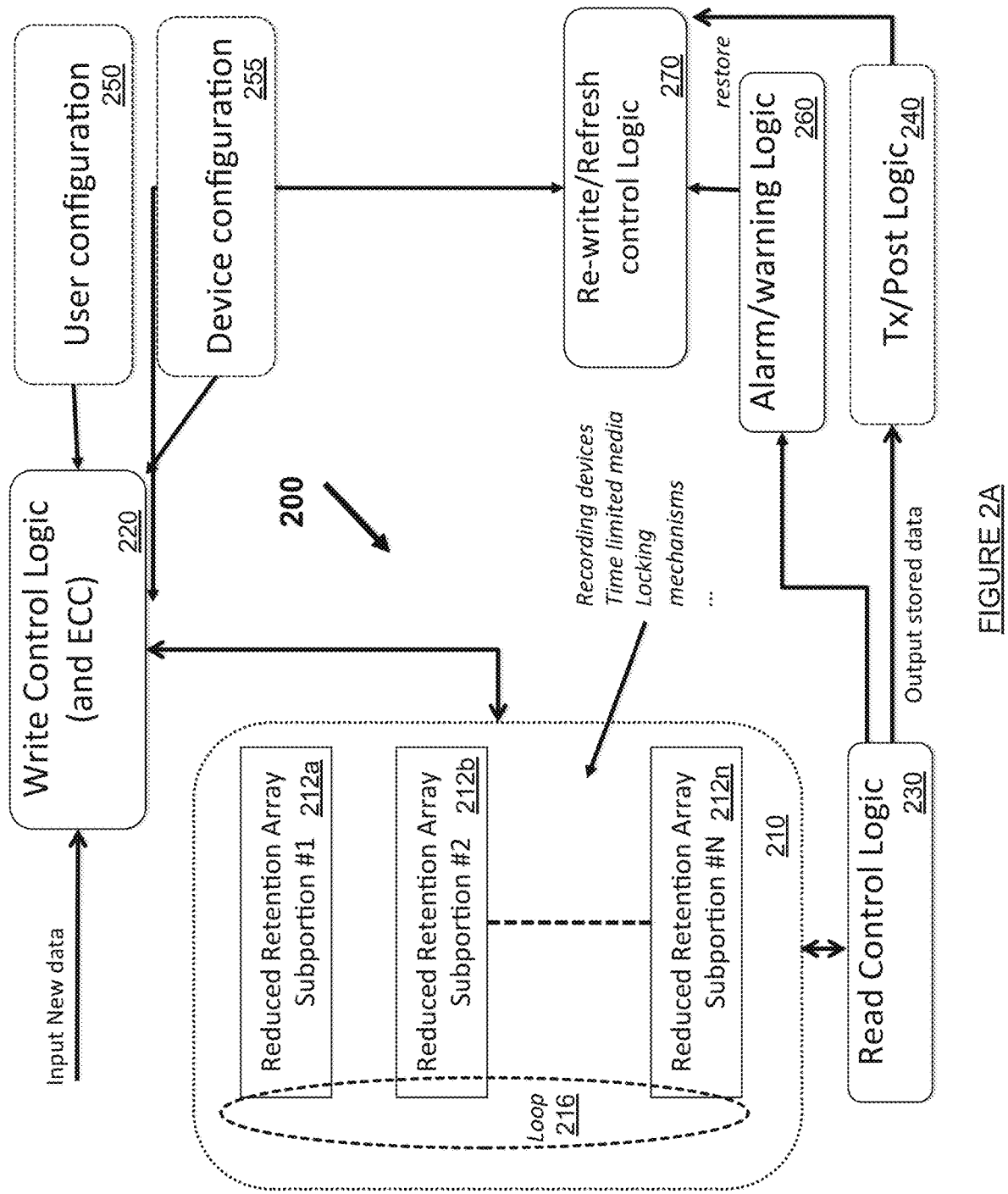
FIG. 2A is a block diagram identifying exemplary components used in an ephemeral memory device of the present invention.

FIG. 2A is a block diagram of a preferred embodiment of an ephemeral memory device 200 of the present invention. This system is preferably implemented on a single integrated circuit chip as all the components are suitable for conventional semiconductor processing.

An ephemeral memory array 210 is included, which includes one or more different types of reduced retention cells 100 as described above, including preferably a modified flash based cell 110. To further reduce complexity and simplify processing, a modified OTP type floating gate cell such as shown in U.S. Pat. No. 8,325,519 or serial no. 14/452,269 can be used as the preferred cell. Such embodiments have the additional benefit that they can be manufactured in standalone form, but are also compatible with logic processing manufacturing, and thus can be incorporated directly into ICs which are primarily logic, including processors, microprocessors, microcontrollers, etc. This eliminates the need for including standalone memory in some applications, and allows for low cost, low density onboard cache.

Array circuit 210 is preferably subdivided into different subportions 212a, 212b . . . 212n. In most applications the characteristics of the array (in terms of charge/time behavior) will be the same, but it is equally possible of course to include subarrays with different performance characteristics. For example one subarray may be configured to self-erase in N hours, while another subarray 212n may be configured to self-erase in M hours (N>M), and so on. The invention is sufficiently flexible to allow for different configuration options, including larger logical clusters, so that the arrays shown herein may in fact be larger storage units, including at a board, rack or system level. Accordingly, while the preferred description here discusses an array on an integrated circuit, it will be understood that this architecture and operation can be extended to larger logical systems, so that data is written/read to larger storage systems in a similar manner.

The arrays can also be configured in an optional "loop" architecture 216, which defines an overall device programming cycle. A write control logic controller circuit 220 (shown below in more detail in FIG. 2B) therefore is programmed with configuration settings that specify what data is stored in which array and at which time. The configuration settings may be a combination of soft user-specified/controlled settings provided through an interface (or register) 250 and hardwired/firmware coded settings from a device configuration circuit 255, which, again, may be a coded register.

Thus the overall "programming cycle" for device 200 consists of a series of timings and relationships between the various sub-arrays (again which may be larger data storage devices) based on their respective capacities, data retention characteristics, desired re-program times, etc. which are implemented by controller 220. Based on an applications' data capture/retention requirements, controller 220 will define a programming cycle that accommodates and effectuates the system requirements. Additional programming "margin" or buffering can be implemented as well.

For example, in a self-erase mode application, each of the n subarrays 212 may have a capacity of M MB and a data retention time Ta. An application may require retaining data for a period Tr, where Tr<=Ta, and in particular Ta=p*Tr where p is some integer. As a simple example, an application may require 2 hours of backup to be saved and readable at any moment in time. If 2 subarrays are used, with 4 hour data retention each, then an overall programming cycle can be 8 hours for the entire device. Alternatively a subarray of 4 memories with each having capacity of 1 hour and retention of 3 hours could be used as well with a cycle of 4 hours (or 3 memories having capacity of 1 hour and a retention of 2 hours for a 3 hour cycle) since they will self-erase prior to a re-programming operation for a next cycle. These times will be longer or shorter depending on the particular application—for example in some cache applications the retention period may be significantly shorter.

Other implementations are possible of course depending on system requirements, such as non-loop applications as described above. Data may be stored in the array 210 by write controller 220 based on a slow erase configuration, or based on a fixed re-write schedule, or some combination thereof based on the user configuration 250 and device configuration data 255. As noted above, an optional refresh cycle can also be implemented to periodically refresh stored data. Imposing the ephemeral characteristics at the device level enforces and assures limited data retention for users in a manner that is far harder to circumvent than current pure application/operating system implemented schemes. This is beneficial particularly for data for which it is very desirable to have an irreversibly limited lifespan (including for example personal photos, sensitive correspondence, etc.).

A read controller circuit 230 is used to read and output data from the ephemeral memory 210 as needed, in response to a read signal, or some other programmed, automated schedule implemented by TX/posting logic circuit 240. In addition, as noted a read controller circuit may optionally automatically erase the read data attendant to a read operation during a follow up or second access. To do this, the array cells (which may be conventional memory cells as noted above) are biased to inject holes that neutralize stored charge. This has the effect of imposing an ephemeral behavior inherent to a one-time read application.

As described herein, the ephemeral data may be moved off-chip (or off-device) if the device is otherwise configured to permit such operation (see configuration data 255) and where it is desired to make a more permanent backup, such as to a cloud or other long term storage facility.

Additional transmitting/posting logic 240 can be included in some embodiments, when it is desirable to create more permanent versions of the ephemeral data. The data can be transmitted, offloaded, etc. to another data storage device, facility, etc., including a cloud based network system. In some applications this operation can occur automatically at predetermined intervals. The stored ephemeral data in 210 (or only portions thereof) may also be moved in response to detecting a predetermined event as well, as identified by a sensor (not shown). For example, an accelerometer sensor (not shown) may indicate that a mobile device (or a flight recorder) is falling or moving over a predetermined rate, and potentially at risk of damage. A temperature sensor (not shown) may generate a signal indicating an absolute temperature, or temperature rise rate exceeding a target threshold. This could lead to a loss of data, so logic 240 detects this event, and moves a desired amount of data from 210 automatically to a permanent memory (which may be onboard). This can ensure also that if a device is lost, or not retrievable for an extended period (several days, weeks, etc. because of a crash for example) at least portions of the data can still be recovered from an ancillary permanent memory.

In other instances a device can detect and automatically backup upon determining that has access to a wireless channel, or is at a predetermined physical location, or has moved beyond a geofenced area, etc. While this option may not offer complete eraseability/security (since some data is backed up to permanent memory) it can still be useful in many applications. Those skilled in the art will appreciate that other events, sensors, etc., (shock, smoke, being dropped in water, etc.) can be integrated into the system to perform a limited automatic backup for a target condition or detected fault, alarm or alert. As will be apparent, these can be based on any desired detected chemical or physical condition.

In the event it is necessary to retrieve and restore already deleted data, additional embodiments can incorporate a restore function, which can coordinate with rewrite control logic 270. The original data is retrieved from the off-chip/off-device storage system, and restored to array 210 as needed. An alarm/warning logic circuit 260 keeps tabs on the state of array 210, including sub-arrays 212, and generates alerts as data in such locations becomes stale. The alerts can be configured to be generated well in advance of such memories reaching an unprogrammed state, for example at 50% of remaining life, 25% of remaining life, and so on, to inform rewrite control logic 270 as well as an operator, user, etc. This feature permits remediation to be performed if (the device is configured to do so) necessary before the original data becomes irreversibly lost.

The present invention affords different levels of erase control, implemented at different hardware and logical levels. These levels are effectuated by the program/erase controller circuit 220 (FIG. 2B) using different combinations of hardwired or programmable instructions.

For example at the most basic level, a self-erase mode is implemented for (all or part of) an ephemeral array 210 through mask/strap configuration options 225 enabled during manufacturing of the device. In this mode the cells self-erase irreversibly during a quiescent state on a predetermined schedule because of engineered leakage from the floating gate. No separate active operations or logistical overhead circuitry are necessary to effectuate this erase, as an oxide thickness is preferably sufficiently small that tunneling occurs directly without an applied bias. Thereafter they can be re-programmed as desired, effectively providing an infinite capacity memory over time since it can be repeatedly re-written (subject to conventional endurance limitations of course). As seen below in FIGS. 5B and 6A, the timing for different phases of such behavior can be controlled as well.

In a second mode, the cells in array 210 may or may not include a self-erase capability, but, instead, are subjected to an additional slow erase operation. As alluded to above, in conventional EPROM cells, a bit is "erased" by removing charge from a floating gate during an erase operation. There are a number of techniques for doing this, including FN tunneling and UV radiation exposure. FN tunneling typically is achieved by applying a large negative voltage to the control gate, which has the effect of driving the electrons off the gate, and through the oxide to the underlying substrate. Another approach involves applying a negative erase voltage bias to the control gate and a positive voltage bias to the drain.

In some embodiments of the present invention therefore, a "slow" erase can be implemented, instead of (or in addition to) using a pure standby or quiescent intrinsic cell charge leakage operation. That is, instead of a typical erase operation which applies a large negative voltage to effectuate erase, the present invention continuously or periodically applies the smallest possible bias (typically a negative voltage to the control gate) required to continue to remove charge to achieve a desired erase time. This "slow bleed" value will vary for each cell design, and can be determined experimentally with routine skill for even conventional (non-ephemeral) cells such as described herein.

The factors that can be controlled here include: 1) the onset of the erase operation; 2) the duration of the erase operation. This ultra-slow erase operation may be useful in some applications where ample power is available to effectuate erase operations, integration density is not critical (so that an erase circuit can be incorporated), etc. As mentioned before, the slow erase operation is performed for ephemeral cells even in the absence of new data (or a new program operation) as part of imbuing an ephemeral characteristic to such cells.

In still another mode, as discussed above, data in an array may be treated and given an ephemeral characteristic by being periodically re-written with new blank or random data (for wear leveling). Again this is preferably done without an erase operation, and simply be re-writing the cells to a higher Vt. However, this can be done several times, allowing for repeated use and extremely cost effective solid state memory. The timing of this can be controlled as noted herein. In applications where refresh is desirable and possible, a refresh of the data can be implemented at any desired interval to maintain data retention.

Finally, as discussed above, in yet another mode, a read operation may include an accompanying erase in a subsequent, immediately following access, so that a hybrid, combined read with erase is affected on the cells in the array. This also has the effect of creating a true, one time visibility of the data for desired applications.

Figure 2B:
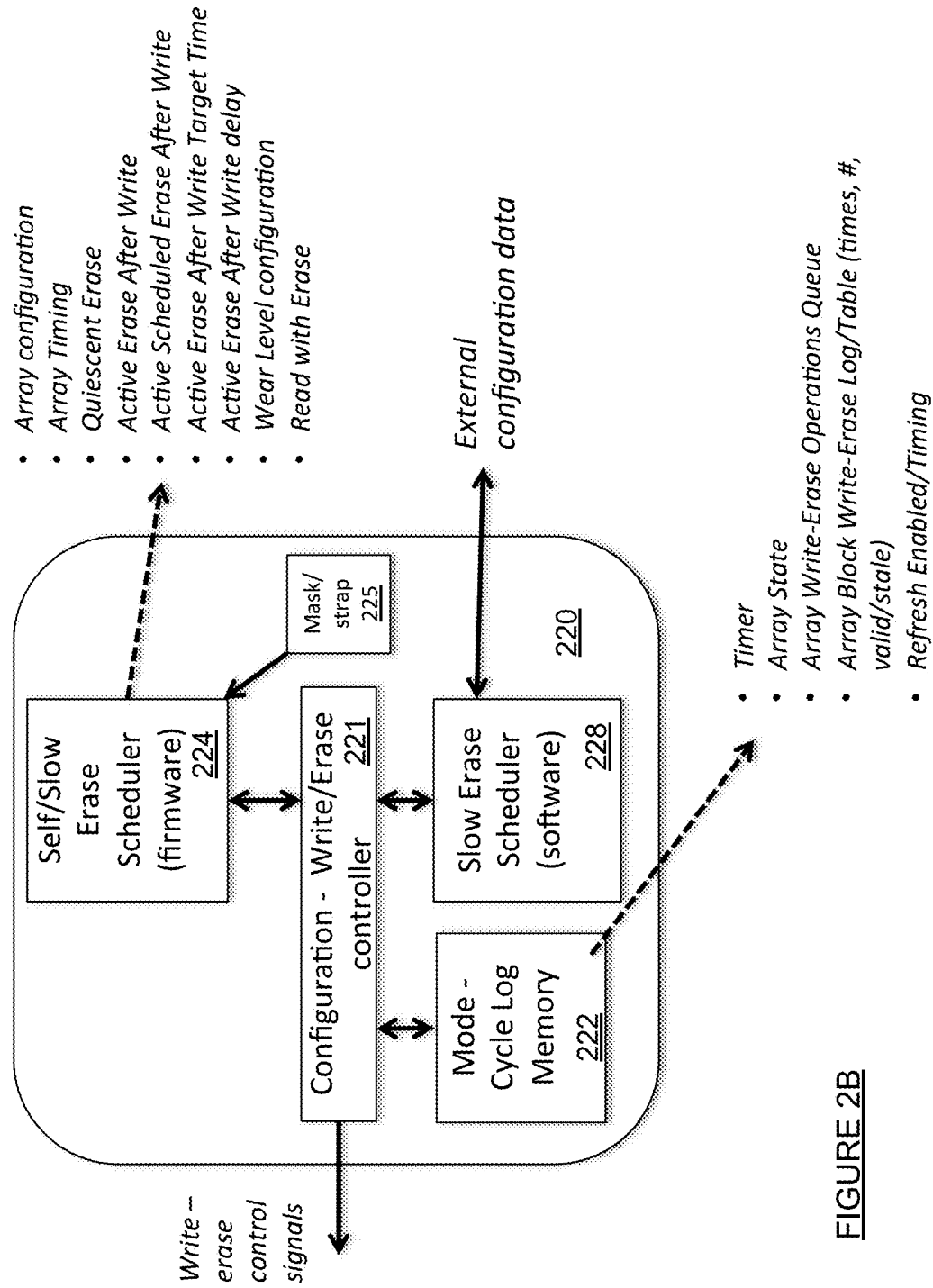
FIG. 2B is a block diagram illustrating exemplary components of a write controller circuit implemented in accordance with the present teachings.

The preferred programmer/write controller logic 220 is further detailed in FIG. 2B. This controller, as described herein, is responsible for effectuating the write and erase control operations for the device in accordance with a number of configuration options that can be specified either or both as hardware or software inputs. A write/erase controller 221 generates appropriate write and erase signals as required for a particular mode (i.e., self-erase, active slow erase, active scheduled erase, refresh) and according to a specific array, schedule, etc.

Device configuration data can include such parameters as:

Array configuration (i.e., bias voltages for write/erase, threshold levels for logic 1/0, block sizes, mode (self erase, active slow erase, active scheduled erase, read with erase) etc.)

Array Timing/Mode (program loop cycle if employed)
Quiescent Erase (enabled/disabled)
Active Erase After Write (enabled/disabled)
Active Scheduled Erase After Write (enabled/disabled)
Active Erase After Write Target Time (onset delay)
Active Erase After Write delay (post onset)
Wear Level configuration (enabled/disabled)
Read with Erase
Refresh time The provisioning of these options is controlled by a combination of hardware and software enabled features. This allows for flexibility in assigning rigorous security in and effectuating the ephemeral characteristics of the data. For example, a mask, fuse or other hardwired wafer—manufacturing level OTP register 225 is used for specifying device options. These options are preferably unalterable, and cannot be bypassed, so they are treated as mandatory specifications by write erase controller 221. As noted above, in some applications write control logic 220 may receive and be responsive to sensor trigger signals generated in response to some target event (i.e. a physical stimulus exceeding some threshold) such as a target movement rate, temperature. The control logic 220 would then initiate an automatic backup to a permanent memory in those applications where security is not critical.

These parameters are then used by a firmware based scheduler circuit 224. This firmware (including coded instructions and data) is also preferably implemented in fixed, unalterable form so that it cannot be tampered with. Scheduler 224 is thus used by write/erase controller 221 to set up and operate the array 210 in accordance with the hardwired array specification.

During operation of device 200, write/erase controller 221 thus generates signals, bias voltages, etc., required to effectuate writing (and re-writing) of data. As it performs such tasks, an internal mode-cycle log memory 222 tracks a state of the device, particularly the array, as it is required to assist write/erase controller 221. For example specific subarray timers, subarray states, subarray write/erase queuing, etc. is maintained. A table of array/block write/erase times is preferably maintained, along with a program count, etc. Other parameters can be tracked as well of course. This operations table is read by and written to by controller 221 to initiate and track all housekeeping operations. For instance each subarray 212 preferably includes entries indicating if it has valid/stale data, a time when such data was written, what mode is implemented, a timer indicating when such data is deemed self-erased, a timer specifying when such data should be re-written (if at all) and so on.

Also shown in FIG. 2B is an external configuration option, in which operating behavior of an ephemeral device can be controlled (at least) in part by soft/dynamic provisioning. An interface (not shown) receives user-specified configuration data from a software application, so that at least some characteristics (overall retention time for example, or backups) can be customized for a particular requirement. For example a user application may specify a lifetime of 1 week for their data on the device for a particular application, while another user may specify a lifetime of 1 year. These options may be presented in addition to or as supplements to the existing hardwired device options. While such implementation is plainly less secure and more prone to alteration, it is still superior to existing ephemeral data control techniques and may be acceptable in some applications.

Figure 3:
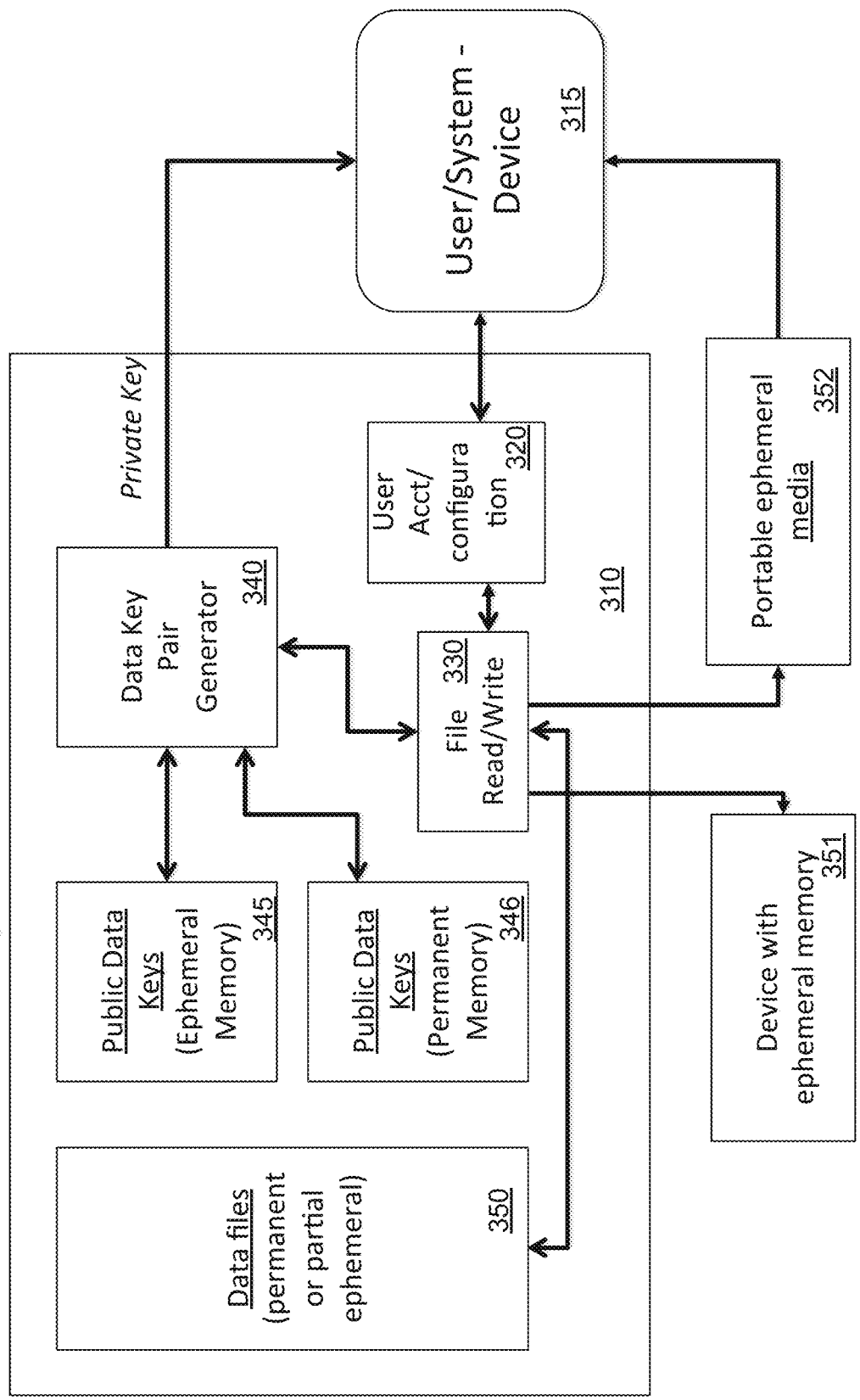
FIG. 3 is a block diagram illustrating exemplary components of an ephemeral data retention system implemented in accordance with the present teachings.

FIG. 3 shows an embodiment of a general ephemeral memory system 300 which has potential use in applications such as content media distributions, social networks, and a number of similar environments. A user or system 310 can issue a request to a read/write logic system 320 for accessing/storing a content file 312 from a storage system. The request can be made across a network (such as the Internet) to a cloud-based type domain, or from a local repository in an intranet, etc. As part of processing such request, a data key pair generator 330 creates a private/public key pair in any convenient manner known in the art. A private key 335 is returned to the user's device/system 310 as seen in FIG. 3, while a public key is stored separately.

The above architecture is typical of many content management systems. The main difference shown in FIG. 3 is that embodiments of the present invention incorporate one or more ephemeral memory devices 340 and/or 350 for storing private key data and content data respectively. The ephemeral memory devices can be of the form shown in FIGS. 1, 2, 4 and 5 discussed herein. Additional "permanent" storage devices 340' and 350' can also be utilized of course.

By incorporating ephemeral memories 340/350 a content management system 300 may be managed with a multimodal file retention behavior, ranging from self-erasing, to slow erasing, to scheduled erase. Each stored content item (which may be a text data file, an image, a video, or some of other multimedia file) for a user or system includes a public key that is configured to expire naturally at the end of some configurable time period. For example, a user could specify that the key should expire after a certain number of hours, days, or months, etc. After the public key expires of its own accord the original data file can no longer be retrieved because this necessary component can no longer be read. Thus, for all effective purposes, the user content file is "lost" or deleted. However, if the user/system 310 requires a higher level of security or privacy, the actual data file storage system 340 could also be implemented in ephemeral form, so that the physical state of the data is also altered irreversibly.

Accordingly a user/system 310 can specify a number of parameters to be used in storing a particular content item, including:
1) whether a public/private key is required;
2) whether the public key is stored in an ephemeral memory;
3) how long the public key should exist;
4) whether the content item should be stored in an ephemeral memory;
5) how long the content item should exist
6) whether the user/system should receive an alert prior to data/key expiration (and, if so, how far in advance);

7) whether the user/system wants to implement automated, permanent backup of their content (and, if so, on what items, what schedule, etc.)

These options can be presented to user/system 310 and selected through any conventional graphic interface within an Internet browser, a smartphone app, or any other similar electronic data input interface. This allows a user for to control creation and destruction of his/her own private content. In a smartphone application for instance a user could specify that all photos are to be stored in an ephemeral memory on the phone, and periodically uploaded to a permanent cloud facility. This would have the additional benefit that a significant portion of the user's free, available storage could be effectively "restored" daily or more frequently to allow for capturing new data (images, videos, and similar multimedia data). A common problem today in smartphone applications, for example, is that users must manually select and delete content that has already been archived. This is inconvenient and time consuming, and could be obviated in systems which performed automated backups. Moreover the size of such smartphone memories could be significantly reduced because not all data would be required to be kept on-device. To prevent situations where a user's data cannot be backed up (due to lack of a broadband connection, or external PC) an optional portable sized memory of sufficient size and permanence could be coupled to the device in question (i.e., through an adapter/interface port) to perform an offload of the otherwise ephemeral data.

In a provider application, a content provider 310 may distribute a content item to a customer (not shown) along with a private key. The content provider can specify a duration for the public key, so that the customer can enjoy access to the time during such period. After the key self-destructs the customer would no longer be able to access such item (absent further authorization). A system operator may include a social network site for example, that allows members to specify controls with their content.

Figure 4:
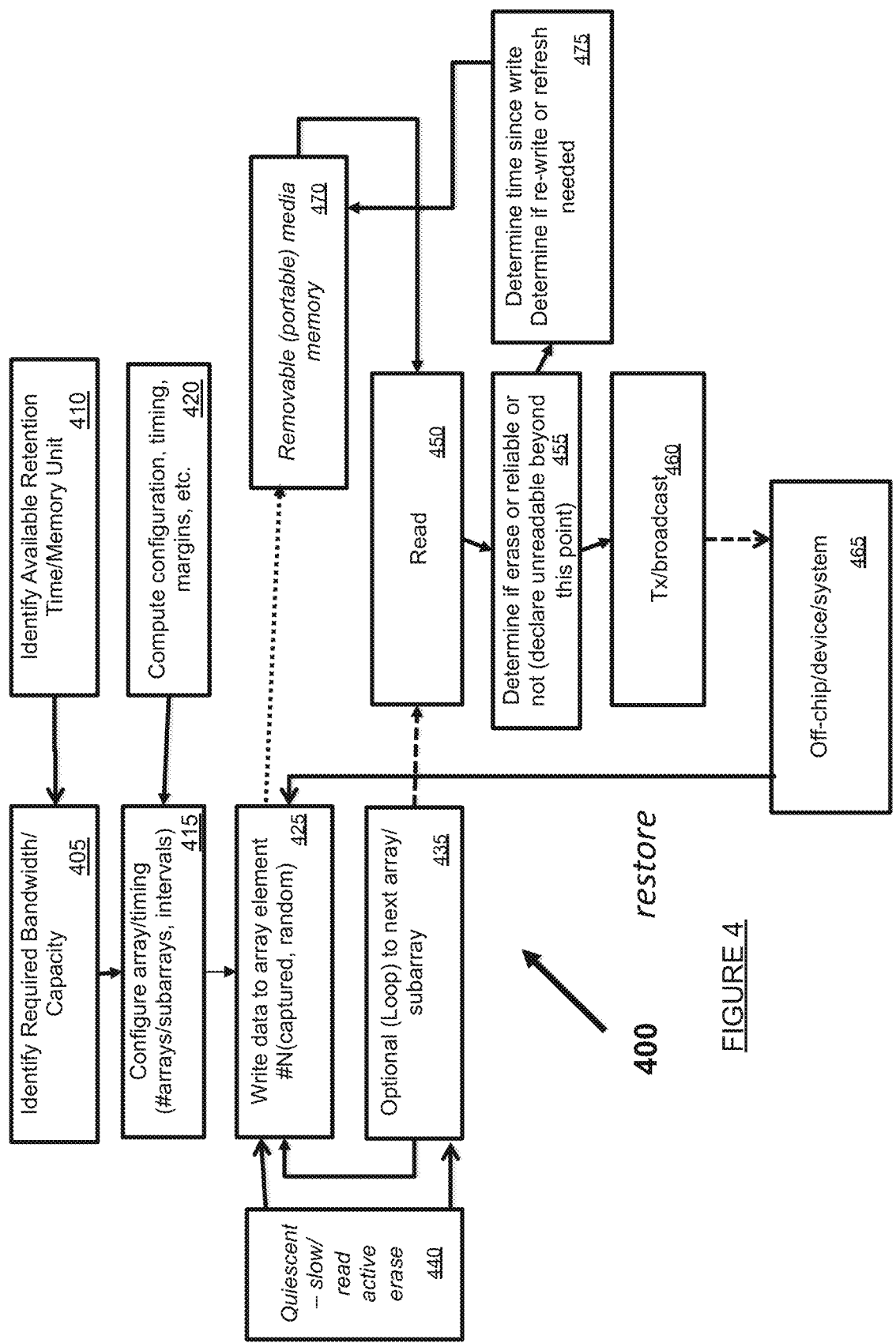
FIG. 4 is a flowchart identifying the main operational steps used for effectuating an ephemeral memory system in exemplary embodiments of the present invention.

FIG. 4 illustrates a general provisioning and program cycle process that can be used with embodiments of the present invention for a particular application. At step 405 the required bandwidth and capacity of the application is determined. For example in a basic security application the system may require data capture of 100 MB per hour and data retained for 2 hours.

Conversely, looking at it from the other perspective, one can begin with a fixed amount of memory or retention time at step 410, and from this information identify the parameters and constraints for a particular application. For example a memory may have a capacity of 1 GB and a nominal data retention time (i.e., a required re-program window) of 4 hours. This information is used to define data capture, cycling and similar parameters for any new application.

At step 420 an array configuration, timing, margins, etc., is determined. This step is based on analyzing the profile of a cell (see FIG. 5B) and the other parameters of the array. In the example above, a 1 GB memory may be partitioned therefore into 10 separate sub-arrays of 100 MB each, and that are programmed sequentially in hourly cycles.

Based on the results of step 420 a program controller 220 (see FIG. 2B, typically on chip with the memory) is then configured to partition the array, and implement the timing for an entire ephemeral loop cycle. For example the controller is configured to operate on a 10 hour cycle, so that each of the 10 100 MB partitions is written sequentially in time.

At step 425 since each partition is only visited every N periods (where N=# partitions*reprogram time/per partition) the total program cycle time of 10 hours meets the desired specification (i.e., data retained for at least 2 hours) and the partition reprogram time (i.e., no sooner than every 4 hours).

At step 435 the controller cycles to the next partition in the array to write the data for a next sequential target time period (1 hour). It will be understood of course that in a static application—where the data is written once and not in a loop fashion—it will not be necessary to perform step 435. This would be the mode used in some of the other ephemeral applications noted below.

Depending on the mode(s) implemented in the array, a passive erase, slow erase, or scheduled erase is performed at step 440. In the case of a quiescent erase, no active step is required. In the case of a slow erase, the controller will implement a reduced stress erase immediately (or after some predetermined delay specified by the system, a user, etc.) and for a predetermined period of time to achieve a full erase. In the case of a scheduled erase, or read with erase, similar parameters can be specified.

At step 450 the data is read as needed. Again, in some applications (security for example) it may not be necessary to "read" data unless called for by the system requirements. In other instances where the memory is storing media content, user content data, etc., the user would be permitted to interrogate and read his/her data.

Step 455 is an optional step that can be implemented as needed in some applications. The controller (see below) can interrogate the cells to see if they are operating within system requirements, and/or log data programmings as they occur to keep track of data expiration periods. This log can be the basis of an alert system that notifies a user or system operator that data should be offloaded to more permanent storage if necessary. In some applications it may be desired to erase the user data immediately or attendant with the read operation, by neutralizing a charge state of the storage element 110.

At step 460 an optional broadcast or transfer of the ephemeral data is performed, again, according to system or user requirements to an off-chip, off-system or off-network virtual appliance 465 such as a cloud computing network. For example in a smartphone application a user may configure his/her device to automatically upload ephemerally recorded data to a cloud environment at some predetermined schedule. An external small storage device could be employed as well in the absence of a network connection. An option can also be provided to permit users to restore selected data from such external device 465. In applications where access to power is not an issue, a refresh cycle can be optionally selected as well. Other embodiments will be apparent to those skilled in the art from the present teachings.

To illustrate the characteristics of the invention more clearly, FIG. 5A shows a typical charge retention timing diagram for a conventional EEPROM cell. For most applications memories of this type are engineered to retain data for 10-100 years or more. As noted above, current efforts in this art are primarily if not exclusively driven by efforts to increase data retention time. This cell, while engineered for longer data retention, can be used nonetheless for some embodiments of the present invention as discussed herein, including for slow-erase, scheduled erase and erase after read configuration.

FIG. 5B shows a preferred embodiment of a charge retention timing diagram for a cell which is implement with limited retention (self-erasing) or controlled slow erase/ scheduled erase/read-erase in accordance with the present teachings. This diagram is highlighted and simplified to illustrate a number of important phases and changes in a preferred operation of such cell.

As seen in FIG. 5B, during a first programming phase or step a charge based cell is programmed to a desired target "program level," at time T1=PA1 T1 to achieve a target Vt. In typical implementations a range of Vt levels are recognized as representing a "programmed" state for a cell. Preferred embodiments of cells of the present invention, however, are engineered to reduce (or lose charge in a quiescent state) intentionally over a predetermined time period, so that at time T2, the cell can no longer be said to be in a "programmed" state. By time T3 the cell has lost sufficient charge that it can be said to be to within a detectable—nominal "unprogrammed" state. The cell continues to lose charge after T3, and at T4 it is a lower range of an unprogrammed level, representing almost a complete loss of charge.

Any time the cell is within a detectable—measurable unprogrammed state, it has effectively lost all the old data, but can re-programmed again with new data at time PA1*t*2. In effect this implements a cell that is controllably "self-erasing" because it does not require a separate erase circuit. Through design and engineering of different structures of the cell (including for example with a reduced thickness tunnel oxide) the various phases of the cell (nominal program retention time (T2), nominal re-program time (T4), reprogramming margin (T4-T3), etc.) can be controlled as desired for any particular application. For example in some applications it may be desirable for the cell to have a programmed/unprogrammed time ratio that is very high or very low. The time margin to re-program could be controlled/reduced so that a smaller number of arrays is required for reliable cycling. The Vt program level and range can be adjusted to system requirements as well, so that the state of the cell can be reliably read and discriminated.

In the embodiment shown here, the cell is designed to retain data for 6*105 seconds, or about 7 days. By the end of 10-12*105 seconds (9-10 days) the cell is well within a self-erased state, and can be safely and reliably re-programmed with new data. Alternatively, as explained herein, a modified automated refresh mechanism can be implemented to periodically update the original contents as desired. The periodic updates can be scheduled for any target time that ensures data retention.

It will be understood that this diagram is only intended to be representative, and that substantial variations will be implemented in different commercial applications. While the charge is shown changing linearly over time, other behaviors (exponential, logarithmic) can be expected or implemented as well.

The various timing parameters are expected to vary according to each specific application as well. For example, in a security application a memory recording device may include 12 separate array sections, each configured to retain an entire day's data for a period of one week. This ensures that as the system cycles daily through the entire 12 day formatted array, any particular array section will be self-erased by the time it is desired to re-write new data. Again these are typical examples and other implementations will be apparent to skilled artisans.

In other applications (described below) the retention can be increased/reduced even further depending on system requirements. For example in a cellphone application, a camera memory may be configured to store data only for 24 hours, with regular updates (e.g., to a cloud backup) saving data permanently as desired. This allows a smartphone memory to be made extremely inexpensive and efficient as it is effectively reused constantly. In addition privacy concerns are reduced in case of loss of such devices, because potentially sensitive photographic/video data (or any other desired data, such as email) is automatically self-erased as well. This can obviate the need for such features as "kill-switches" and the like, and so-called self-deleting apps (Cyberdust, Instagram) because the data in the device is already configured to expire after a short duration. In this respect embodiments of the invention can help to actualize devices that behave like human memory, in that they can be made to "forget" data after a predetermined period. For "warm" data applications, including cache applications, a flash memory cell is configured to store the data for a few minutes or at most a few hours, after which it is likely already stale.

Note that limited data retention cells in the prior art are uniformly characterized as undesirable, and furthermore are usually the uncontrolled byproduct or result of cycling induced damage. That is, the threshold voltage window closure is caused by degradation, defects, charge trapping, etc. in the device, particularly the oxide or various interfaces. This damage results from excessive write/erase operations which inhibit or impair proper and reliable programming of the cell. In other words, prior art data cells with limited retention suffer from significant performance advantages and limited functionality which otherwise render them unusable as storage devices. Typically, both read/write and endurance are significantly compromised. Furthermore in most instances limited data retention is achieved only by increasing a temperature of the device (during burn-in for example) to accelerate a natural charge leakage rate, and/or by the use of exotic dielectric compositions that are not compatible with generic wafer processing. In the present embodiments a limited data retention cell is intentionally engineered—in contravention of commonly accepted theories—but without the associated damage which would prevent regular and continued reliable programming. This allows for conventional room temperature operation as well. Since the factors which affect programming operation speed, reliability (for CHEI or FN tunneling) are relatively independent (or can be de-coupled) from erase operations, it is expected that a number of different cell designs (determined from routine experimentation) will be found to be useful for effecting the goals of the present teachings.

It is expected that the ephemeral cells 100 may be incorporated as part of higher security storage areas of an integrated circuit. In such instances there may also be conventional non-volatile memory cells incorporated on the same IC. For purposes of comparison, and to achieve the aims of the present disclosure, the tunnel oxides of the ephemeral cells are expected to range and be architected to have a target thickness between 60-90% of the thickness of the nominal cells found in other arrays on such chips, or of that used in nominal sized cells at a particular process geometry in standalone applications. In an integrated system, this oxide layer duality can be achieved using conventional semiconductor techniques including by selective masking operations. In some these applications, because the limited data retention cell oxides can be made very thin, an embedded limited data retention array can be manufactured along with conventional logic and/or I/O devices on a chip in embedded applications. As noted above, this only requires the addition of a refresh mechanism by a memory controller to periodically re-write the data.

In embodiments using an active slow erase operation, the timing diagram and options will be similar, except that it may be accelerated of course based on the additional biasing imposed on the array to expedite the erase. The various retention times, reprogram times, etc. can be tailored as needed. It will be understood of course that in such applications that the individual cells need not have the same self-erasing capability as noted above.

In embodiments using a scheduled erase or read with erase, the charge retention characteristics can nominally track those of a standard flash cell, or the OTP cell noted above in Ser. No. 14/452,269. The cell does not self-erase, or use any form of erase, but is simply re-programmed at desired intervals (PA1T2) and/or as part of a read operation to achieve a mandatory scheduled erase of the original data. The original data can be replaced with new data, or simply written over with blank or random data as desired.

Figure 6A:
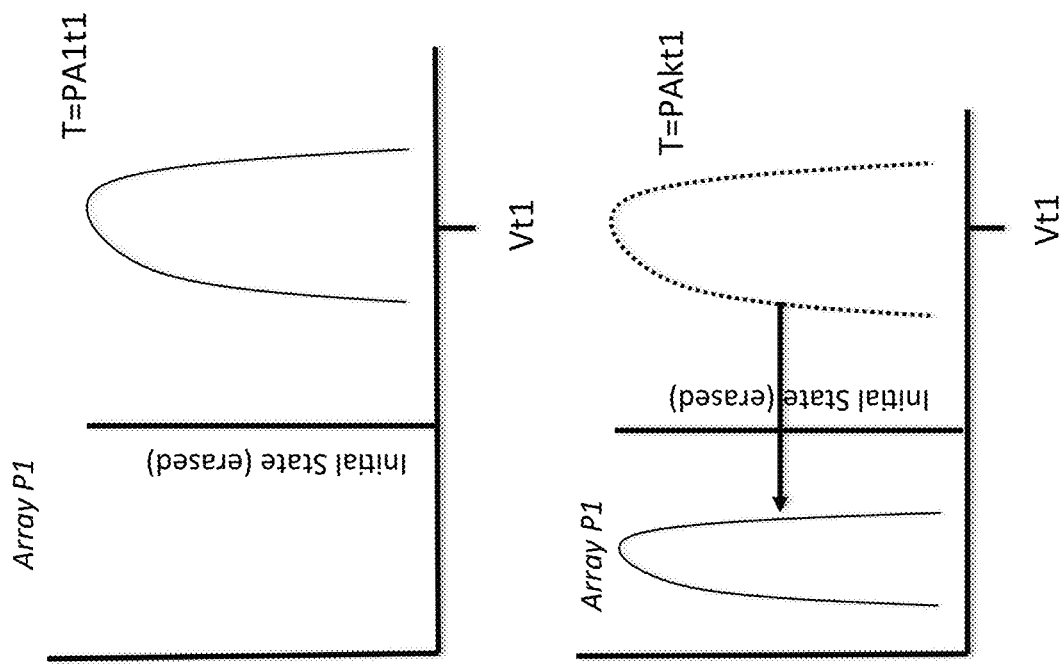
FIG. 6A is a diagram depicting a typical program and self-erase operation of a non-volatile memory cell implemented in accordance with the present teachings.
Figure 6B:
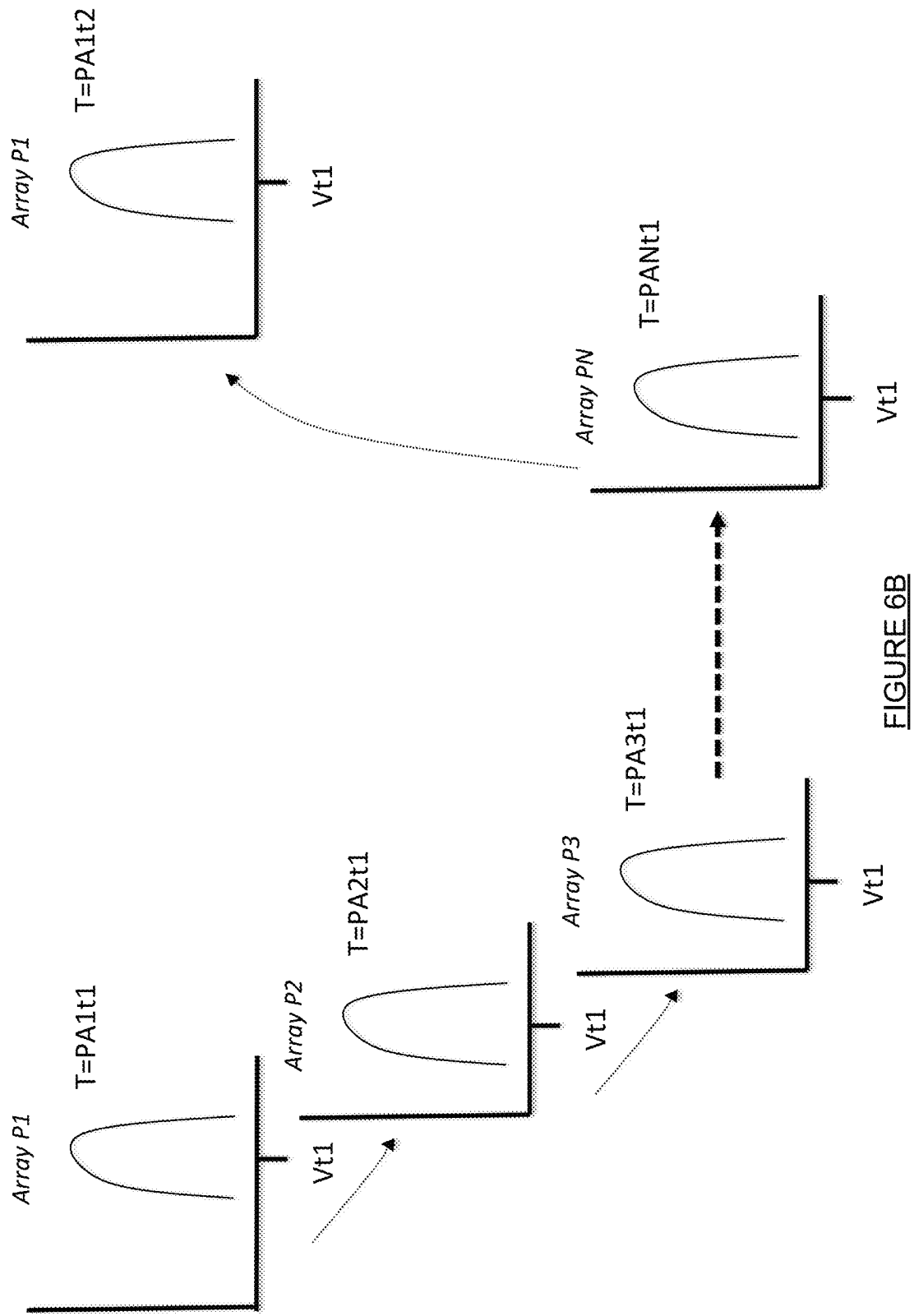
FIG. 6B is a diagram depicting a typical program and self-erase operation of subportions of an array of non-volatile memory devices implemented in accordance with the present teachings.

FIG. 6A is a diagram depicting a typical program and self-erase operation of a preferred non-volatile memory cell implemented in accordance with the present teachings. After a cell is placed into a higher programmed Vt state, it will self-erase during a quiescent mode below a nominal lower unprogrammed state. FIG. 6B is a diagram depicting a typical program and self-erase operation of subportions of an array of non-volatile memory devices implemented in accordance with the present teachings. Each array (P1, P2 . . . PN) is programmed at a different time (PA1T1, PA2T1 . . . PANT1 and so on) to a desired target Vt level. In a loop configuration, by the time PANT1 has transpired, P1 is ready to be re-programmed.

Loop/Cache Memory

Embodiments such as shown in FIGS. 2A and 4 may be implemented in a loop or cache configuration as noted above. In a security application, a camera may have a performance specified frame capture (FC) rate or number of frames (F) per unit time (T), for example 24 frames per second. Each frame may require a number of bytes to encode, again, as an example for a reasonable definition image, we can set this at 1M pixels. Since pixels are directly correlated with a predetermined number of bytes, they can be used as a proxy in this example. Accordingly 24 MP per second must be stored in a digital storage device. This translates to:

24M P/sec*24 hours/day*3600 sec/hour

Or slightly more than $2*10^{12}$ pixels per day

This is a significant amount of data, and even with compression (such as MPEGx) it can only be significantly reduced by a factor of 50-100. Further reductions could be made of course using conventional techniques, including lower level coding. Most applications do not require full HD bandwidth so this is a conservative figure.

Using these rough assumptions, a storage device therefore may need capacity for $2*10^{10}$ or about 20 GP per day. This is achievable at reasonable cost using extremely low cost OTP type memory cells such as described in the aforementioned Ser. No. 14/452,269 application.

The camera operator may also specify a minimum retention time for the image data based on their specification or requirements, for example N days, where N is 7 (for one week).

This means that the total memory capacity (minus overhead for redundancy, error correction, etc.) would be about 15*20 or 300 GP per period. To achieve this result, the limited retention cells of the present invention would be configured in an array having a nominal capacity of say 500 GP, which would allow for guaranteed capture of the target N (7) days with additional "fade" margin. This additional fade margin ensures that as the memory write controller cycles back to the top of the array to write new data, the previously stored data has decayed, degraded and or has been naturally erased as noted above. In a preferred embodiment using a modified OPT cell, the existing decayed data is then re-written to an initial state (as described in Ser. No. 14/452,269). From there any new data for the N+1th cycle is written into the array.

It will be understood that the amount of margin or fade padding can be adjusted for each application as needed. It is also a function of course of the type of memory element that is employed, as each different cell (organic, ferroelectric, magnetic, eprom) will have different data loss characteristics.

Another application for which the "loop" or cache configuration may be suitable for is in network processors and other similar router devices which typically include some Flash for limited features, but conventionally store packet routing data in a (volatile) DRAM table. Because the routing data by its nature is very dynamic, a flash based ephemeral loop memory can be appropriately sized and configured to service such application as well as it is relatively inexpensive. This would provide non-volatility of course as well. Note that in some embodiments the ephemeral memory may be integrated directly onboard a network processor or other (micro) controller IC, because in a modified OTP configuration (see SN 14/452,269) the cell is compatible with CMOS logic manufacturing operations.

Additional Applications

In addition to the applications noted above, the ephemeral memory here enables a number of new applications and/or improves a number of existing applications.

Cloud based systems could employ the present embodiments to create controlled, ephemeral solid state storage systems. Users could be given dedicated secure zones for different applications (on mobile for example) to place their data, with selectable data retention times and alerts. A text message app for example may use a different memory and retention time than an email app. This can be controlled through operating system level settings for any particular device. In self-erasing modes users would have effectively (almost) unlimited storage as old data is automatically overwritten with new data. As with the other dedicated embodiments users could elect to receive alerts of expiring data, or to migrate their data to a permanent facility.

For USB flash-stick/portable memory applications, the present invention allows for additional security, and solves the problem of not being able to reliably confirm that data has indeed been purged or removed from a device after it is lost or misplaced. As the memory can be configured to self-erase after any desired time period (days or even hours), there is no need to implement or confirm a separate erase operation (as is done remotely by some self-destruct architectures), and little possibility for such data to remain. Embodiments of the invention therefore can be implemented to achieve target security requirements imposed by governmental agencies, including by self-sanitization.

Vehicle and security monitoring is also improved. A blackbox recorder for example could be implemented with the ephemeral memory described herein. Navigation, instrumentation and other data could be recorded in a loop fashion as well.

Automobiles, including rental applications, could also use the technology as part of an automated safety recording box. Information on gps coded locations, driving speeds, driver maneuvers, etc., can be preserved for accident and similar accountings. Since most rentals are limited in time to a few days or weeks, it is not necessary usually to record more data than this for any particular rental contract period. If the rental company does not migrate the data, the vehicle renter is also assured that his/her data is erased automatically and not used later.

In business (or home) installations it is common to use closed loop security cameras that record with video tape or similar analog technology for surveillance and audit functions. Home sensors such as smoke alarms, intrusion detection, can also be fitted with ephemeral memories to reduce power and footprint. The present invention allows for digital, solid state equivalents that recycle/reuse data storage in a similar perpetual configuration. Again since it is not usually required (in most security applications) to maintain data for more than a limited period, such as a few hours or a few days.

Electronic wrist bands, debit cards and similar key/pass technology could be adapted with ephemeral recording technology as well. For example resorts, casinos, or an amusement park ticket with a data retention period of no more than N (e.g. 8) hours could be re-used, with little fear of abuse or cheating since the coding would self-erase and not carry over to a new day.

Electronic keys, including hotel room keys can be similarly coded at the time of arrival with the duration of the guest's stay. After such time the key expires on its own and would not have to be erased as is presently done.

Some secure installations may impose self-erasing memory requirements to reduce cyber-theft. For example, the use of computing systems within the facility may be restricted so that only authorized machines are allowed on the premises, and only ephemeral memories having a data retention capability below a target time threshold are allowed for extracting and moving data between machines. The only requirement, of course, is that the data be retained for a sufficient time to allow it to be read reliably in its entirety. Since many applications involve simply copying and transferring one file from one machine onto another machine within a few minutes, a USB drive within a secure facility could be configured to retain or self-erase within minutes or at most hours. Similarly, employee owned devices may be configured with ephemeral memories in one of the desired modes, so that particular data in secured designated areas of a storage device are routinely deleted after a target number of hours.

In electronic media applications, it is sometimes desirable to rent entertainment content on a short term basis. In the past it was known to use optical media that degraded over time to become non-readable. These embodiments were useful for security purposes, but could not be re-used. Embodiments of the present invention could be implemented in electronic kiosk rental applications which permit use of content for a fixed, finite rental period. A user simply selects a desired content item at the kiosk using a conventional graphical interface. The user then inserts their own personal portable ephemeral memory, and receives a coded temporary copy through an interface (such as high speed USB). The ephemeral memory is validated as authentic for receiving the digital content item. A temporary copy can be secured with other conventional known mechanisms (including encryption or steganography) to prevent duplication as well. At the end of the rental period the content simply self-erases, which allows for the re-use of the content storage device for another content item.

In most of these implementations an end user can be provided with a mode switch or configuration option which allows for using either a conventional permanent memory, or a more secure, ephemeral memory of the present embodiments. This allows for further flexibility so that each item of information (a file, a photograph, video, email, etc.) can be stored as needed on a case-by-case basis according to such item's requirements and/or the user needs. Further configuration rules can be implemented so that different kinds of media are automatically designated for ephemeral or permanent storage. For example a user may configure a smartphone so that all photos are automatically stored in a secure ephemeral memory only unless specifically tagged otherwise. Other options for such configurations will be apparent to those skilled in the art and will vary according to the particular application.

Sensitive communications (including emails, text messages, etc.) may be directed to secure memory storage, where they are similarly auto-deleted in very short time spans. If no "permanent" version of a file is created (e.g., it is erased immediately after capture) there is no danger that such materials can be exploited by third parties.

What is claimed is:

1. A memory device on an integrated circuit adapted with ephemeral data retention capability comprising:
    an array of charge storage elements;
    wherein said charge storage element is characterized by an inherent leakage current and is configurable:
        to store a first amount of charge corresponding to a first unprogrammed state representing a first data value; and
        to store a second amount of charge corresponding to a second programmed state representing a second data value;
    a programming control circuit configured:
        to set said array of charge elements to said second programmed state representing said second data value based on a first write operation;
        to initiate and control a first scheduled erase operation in which all charge is removed from a selected charge storage element over a first predetermined erase period;
        to initiate and control a second separate slower erase operation on said array, during which a controlled erase charge is actively removed from selected charge storage elements over second predetermined erase periods that are longer than said first determined period and in the absence of a new second write operation for such array;
    wherein said programming control circuit is adapted to actively impose erase bias voltages to said array of charge storage elements during said controlled predetermined period so that said controlled erase charge is removed from such elements in addition to charge lost to leakage current by such elements.

2. The device of claim 1 wherein said programming control circuit is configured so that said erase operation can erase said charge storage elements and set a new unprogrammed state by setting respective threshold voltages of said charge storage elements to a first threshold voltage.

3. The device of claim 2 wherein a new second write operation can set a new programmed state by setting the respective threshold voltages to a second threshold voltage higher than said first threshold voltage.

4. The device of claim 1 wherein said predetermined erase periods can be controlled by a software application.

5. The device of claim 1 wherein said predetermined erase periods are fixed in physical form on the integrated circuit.

6. The device of claim 1 wherein said erase operation cannot be disabled by any control signal provided to the integrated circuit and occurs automatically to implement a forced erase of any array data.

7. The device of claim 1 further including an alert circuit for generating an alert at a target time indicating an impending erase.

8. The device of claim 1 wherein the programming control circuit is configured to cause holes to be injected into a floating gate of the selected charge storage elements.

9. The device of claim 1 wherein the programming control circuit is configured to cause apply the smallest possible bias required to remove charge from the selected charge storage elements during said controlled predetermined period to achieve a target data retention time.

10. The device of claim 1 wherein the selected charge storage elements are part of a secure storage area on the integrated circuit.

11. The device of claim 1 wherein the programming control circuit is configured to cause Fowler-Nordheim tunneling to remove said charge during said controlled predetermined period.

12. The device of claim 1 wherein the programming control circuit is configured to cause a negative erase voltage to be applied to a control gate of the selected charge storage elements and a positive voltage to a drain of said selected charge storage elements to remove said charge during said controlled predetermined period.

13. The device of claim 1 wherein a refresh operation is implemented by the programming control circuit with timing based on a target data retention characteristic of said charge storage element.

14. A memory device on an integrated circuit adapted with ephemeral data retention capability comprising:
   an array of charge storage elements;
   wherein each charge storage element in said array is characterized by an inherent leakage current and is configurable:
      to store a first amount of charge corresponding to a first state corresponding to a first state representing a first data value; and
      to store a second amount of charge corresponding to a second state representing a second data value;
   a programming control circuit configured:
      to program said array of charge storage elements to said second data value based on a first write operation;
      to initiate and control a slow erase operation on said array, including at least a first mode in which a controlled erase charge is actively removed from a selected charge storage element over a controlled predetermined period and in the absence of a new second write operation for such selected charge storage element;
      to actively impose erase bias voltages to said array of charge storage elements during said controlled predetermined period so that said controlled erase charge is removed from such elements in addition to charge lost to leakage current by such elements; and
      to apply the smallest possible bias required to remove charge from the selected charge storage elements during said controlled predetermined period to achieve a target data retention time.

15. The device of claim 14 wherein the memory device includes a second array of charge storage elements and the programming control circuit is configured to implement a second controlled erase operation over a second predetermined period for such elements.

16. The device of claim 14 wherein the charge storage elements are electrically programmable memory cells.

17. The device of claim 14 wherein the memory device is embedded with other logic and I/O devices on the integrated circuit.

18. A memory device on an integrated circuit adapted with ephemeral data retention capability comprising:
   an array of charge storage elements;
   wherein said charge storage element is characterized by an inherent leakage current and is configurable:
      to store a first amount of charge corresponding to a first unprogrammed state representing a first data value; and
      to store a second amount of charge corresponding to a second programmed state representing a second data value;
   a programming control circuit configured:
      to set said array of charge elements to said second programmed state representing said second data value based on a first write operation;
      to initiate and control an erase operation on said array, including at least a first mode in which a controlled erase charge is actively removed from selected charge storage elements at predetermined erase periods and in the absence of a new second write operation for such array;
      to actively impose erase bias voltages to said array of charge storage elements during said controlled predetermined period so that said controlled erase charge is removed from such elements in addition to charge lost to leakage current by such elements; and
      to cause apply the smallest possible bias required to remove charge from the selected charge storage elements during said controlled predetermined period to achieve a target data retention time.

19. The device of claim 18 wherein the memory device includes a second array of charge storage elements and the programming control circuit is configured to implement a second controlled erase operation over a second predetermined period for such elements.

20. The device of claim 18 wherein the charge storage elements are electrically programmable memory cells.

21. The device of claim 18 wherein the memory device is embedded with other logic and I/O devices on the integrated circuit.

22. A memory device on an integrated circuit adapted with ephemeral data retention capability comprising:
   an array of charge storage elements;
   wherein each charge storage element in said array is characterized by an inherent leakage current and is configurable:
      to store a first amount of charge corresponding to a first state corresponding to a first state representing a first data value; and
      to store a second amount of charge corresponding to a second state representing a second data value;
   a programming control circuit configured:
      to program said array of charge storage elements to said second data value based on a first write operation;
      to initiate and control a slow erase operation on said array, including at least a first mode in which a controlled erase charge is actively removed from a selected charge storage element over a controlled predetermined period and in the absence of a new second write operation for such selected charge storage element;
   wherein said programming control circuit is adapted to actively impose erase bias voltages to said array of charge storage elements during said controlled predetermined period so that said controlled erase charge is removed from such elements in addition to charge lost to leakage current by such elements, by applying the smallest possible bias required to remove charge from the selected charge storage elements during said controlled predetermined period to achieve a target data retention time;

further wherein a nominal data retention time capability of the selected charge storage elements is actively shortened by said slow erase operation.

23. The memory device of claim 22 wherein said controlled predetermined period ranges from $10^4$ to $10^6$ seconds.

24. The memory device of claim 22 wherein said array is partitioned into a plurality of subarrays of charge storage elements, and each of said plurality of subarrays is subjected to said slow erase operation at a different time in a predetermined program sequence.

25. The device of claim 22 wherein the programming control circuit is configured to cause holes to be injected into a floating gate of the selected charge storage elements.

26. The device of claim 22 wherein the selected charge storage elements are part of a secure storage area on the integrated circuit.

27. The device of claim 22 wherein the programming control circuit is configured to cause Fowler-Nordheim tunneling to remove said charge during said controlled predetermined period.

28. The device of claim 22 wherein the programming control circuit is configured to cause a negative erase voltage to be applied to a control gate of the selected charge storage elements and a positive voltage to a drain of said selected charge storage elements to remove said charge during said controlled predetermined period.

29. The device of claim 22 wherein a refresh operation is implemented by the programming control circuit with timing based on a target data retention characteristic of said charge storage element.

30. A memory device on an integrated circuit adapted with ephemeral data retention capability comprising:
an array of charge storage elements;
wherein said charge storage element is characterized by an inherent leakage current and is configurable:
to store a first amount of charge corresponding to a first unprogrammed state representing a first data value; and
to store a second amount of charge corresponding to a second programmed state representing a second data value;
a programming control circuit configured:
to set said array of charge elements to said second programmed state representing said second data value based on a first write operation;
to initiate and control an erase operation on said array, including at least a first mode in which a controlled erase charge is actively removed from selected charge storage elements at predetermined erase periods and in the absence of a new second write operation for such array;
wherein said programming control circuit is adapted to actively impose erase bias voltages to said array of charge storage elements during said controlled predetermined period so that said controlled erase charge is removed from such elements in addition to charge lost to leakage current by such elements;
further wherein a nominal data retention time capability of the selected charge storage elements is actively shortened by said slow erase operation.

* * * * *